United States Patent
Kuisma et al.

(10) Patent No.: US 11,527,497 B2
(45) Date of Patent: Dec. 13, 2022

(54) ELECTRICAL COMPONENT WITH COMPONENT INTERCONNECTION ELEMENT

(71) Applicant: MURATA MANUFACTURING CO., LTD., Nagaokakyo (JP)

(72) Inventors: Heikki Kuisma, Helsinki (FI); Sami Nurmi, Tuusula (FI)

(73) Assignee: MURATA MANUFACTURING CO., LTD., Nagaokakyo (JP)

( * ) Notice: Subject to any disclaimer, the term of this patent is extended or adjusted under 35 U.S.C. 154(b) by 12 days.

(21) Appl. No.: 17/327,278

(22) Filed: May 21, 2021

(65) Prior Publication Data
US 2021/0375801 A1 Dec. 2, 2021

(30) Foreign Application Priority Data
May 26, 2020 (FI) .................................... 20205533

(51) Int. Cl.
*H01L 23/00* (2006.01)

(52) U.S. Cl.
CPC .............. *H01L 24/02* (2013.01); *H01L 24/03* (2013.01); *H01L 24/05* (2013.01); *H01L 24/13* (2013.01); *H01L 2224/0236* (2013.01); *H01L 2224/0239* (2013.01); *H01L 2224/02351* (2013.01); *H01L 2224/02375* (2013.01); *H01L 2224/02381* (2013.01); *H01L 2224/0401* (2013.01); *H01L 2224/05555* (2013.01); *H01L 2224/05558* (2013.01); *H01L 2224/05569* (2013.01); *H01L 2224/1319* (2013.01); *H01L 2224/1357* (2013.01); *H01L 2224/13147* (2013.01); *H01L 2924/01029* (2013.01); *H01L 2924/3512* (2013.01); *H01L 2924/35121* (2013.01)

(58) Field of Classification Search
CPC ...................................................... H01L 24/13
See application file for complete search history.

(56) References Cited

U.S. PATENT DOCUMENTS 9,258,904 B2 * 2/2016 Pendse .................... H01L 24/29
9,545,014 B2 * 1/2017 Pendse .................... H01L 24/11
(Continued)

FOREIGN PATENT DOCUMENTS

| JP | 01-191451 A | 8/1989 |
|---|---|---|
| JP | 2004-134606 A | 4/2004 |

(Continued)

OTHER PUBLICATIONS

European Search Report dated Nov. 30, 2021 corresponding to European Patent Application No. 21175145.

(Continued)

*Primary Examiner* — William A Harriston
(74) *Attorney, Agent, or Firm* — Squire Patton Boggs (US) LLP

(57) ABSTRACT

An electrical component including a substrate, a first dielectric layer on the substrate, a redistribution layer pad on the first dielectric layer, and a component interconnection element on the redistribution layer pad so that the component interconnection element fills an opening in the second dielectric layer. The opening includes at least one protrusion between the component interconnection element solder ball metallization and the redistribution layer pad.

21 Claims, 12 Drawing Sheets

(56) References Cited

U.S. PATENT DOCUMENTS

| | | |
|---|---|---|
| 2002/0071935 A1 | 6/2002 | Wu |
| 2005/0023679 A1 | 2/2005 | Liu |
| 2005/0258544 A1* | 11/2005 | Kim .................... H05K 3/3452 257/773 |
| 2011/0049725 A1 | 3/2011 | Topacio et al. |
| 2013/0147033 A1* | 6/2013 | Chen ................... H01L 23/3192 257/737 |
| 2014/0252610 A1 | 9/2014 | Chen et al. |
| 2016/0254221 A1* | 9/2016 | Kim .................. H01L 23/49838 257/738 |
| 2018/0145028 A1* | 5/2018 | Kobayashi ........ H01L 23/53295 |
| 2018/0294186 A1* | 10/2018 | Lam ........................ H01L 24/02 |

FOREIGN PATENT DOCUMENTS

| | | |
|---|---|---|
| JP | 2007-208209 A | 8/2007 |
| JP | 2009-032754 A | 2/2009 |
| JP | 2009-182274 A | 8/2009 |
| JP | 2016-092339 A | 5/2016 |
| JP | 2017-059801 A | 3/2017 |
| JP | 2018-038386 A | 3/2018 |
| WO | WO 2013/170197 A1 | 11/2013 |

OTHER PUBLICATIONS

"Integrated testing, modelling and failure analysis of CSPnITM for enhanced board level reliability" by Rex Anderson, Tong Yan Tee, Tan Long Bin and Hun Shen Ng in the Proceeding of SMTA's 5th Annual International Wafer Level Packaging Conference, Oct. 15-16, 2008, San Jose CA.

"FO-WLP multi-DOF inertial sensor for automotive applications" by H. Kuisma, N. Mäntyoja, S. Nurmi, A. Cardoso, R. Rosenkrantz and M. Gall in the Electronics System-Integration Technology Conference, Sep. 18-21, 2018, Dresden, Germany.

Finnish Search Report dated Dec. 11, 2020 corresponding to Finnish Patent Application No. 20205533.

Notice of Reasons for Refusal dated Jul. 19, 2022 corresponding to Japanese Patent Application No. 2021-085022, with English translation thereof.

* cited by examiner

A - A

ELECTRICAL COMPONENT WITH COMPONENT INTERCONNECTION ELEMENT

FIELD OF THE DISCLOSURE

The present disclosure relates to electrical components, and particularly to electrical components with one or more component interconnection elements for packaged connections. The present disclosure further concerns a packaged device and a method for manufacturing an electrical component.

BACKGROUND

Conductive component interconnection elements, like solder balls, are commonly used for connecting a ball grid array (BGA) packaged component, a wafer level packaged (WLP) component or a fan-out wafer level packaged (FOWLP) component to a printed circuit board. When the electrical component attached by many solder balls on a circuit board undergoes temperature variations, a stress will arise to the interconnection due to different coefficients of thermal expansion of the silicon or substrate material, packaging material and the circuit board material. The difference between thermal expansion coefficients can be very large, up to 10 ppm/° C., and will cause plastic deformation, creep and eventually fracture due to fatigue of the materials when the temperature change is repeated many times.

The first identified problems related to fatigue of the solder ball material, but it was detected that they can be solved by careful design and material optimization, by applying elastic polymer material between the solder ball and the component and by keeping the maximum distance between solder balls small. However, once this issue was overcome, cracking of the redistribution layer pad underneath the solder ball was observed. FIG. 1A shows images of redistribution layer pad cracking from document "Integrated testing, modelling and failure analysis of CSP$^{nITM}$ for enhanced board level reliability" by Rex Anderson, Tong Yan Tee, Tan Long Bin and Hun Shen Ng in the Proceeding of SMTA's $5^{th}$ Annual International Wafer Level Packaging Conference, Oct. 15-16, 2008, San Jose Calif. FIG. 1B shows a cross section of a solder ball and redistribution layer pad after 2000 thermal cycles between −50 and +150° C. from document "FO-WLP multi-DOF inertial sensor for automotive applications" by H. Kuisma, N. Mantyoja, S. Nurmi, A. Cardoso, R. Rosenkrantz and M. Gall in the Electronics System-Integration Technology Conference, Sep. 18-21, 2018, Dresden, Germany. In both cases, the cracking takes place in the place where the solder ball metallization contacts the redistribution layer pad. In worst case the crack may extend around the whole redistribution layer pad and impair the electrical continuity from the solder ball to a lead that integrates the pad to the overall redistribution layer structure. In the extreme, such cracks can cause an open circuit or an intermittent contact break to the overall component package.

BRIEF DESCRIPTION

An object of the disclosed embodiments is to provide the electrical component design that enables reduction of overall cracking and limits the extent of propagation of possible cracks in the redistribution layer pad. This increase durability of the component, specifically in demanding operating conditions where temperature variations may be frequent and large.

This object is achieved by the electrical component, and the electrical component package which are characterized by what is stated in the independent claim. Advantageous embodiments of the disclosure are disclosed in the dependent claims.

The solution disclosed with the embodiments is based on using a specific layered electrical component configuration that minimises fatigue of the solder ball material and cracking of the redistribution layer pad, and further prevents crack propagation in the redistribution layer pad if such cracks should occur. This increases the likelihood that in at least part of the redistribution layer pad, electrical current can flow undisturbed from the solder ball to the outer parts of the redistribution layer pad where leads to the integrating redistribution layer structure are. The overall increased robustness of the electrical component can be achieved without essentially changing the overall dimensions of the electrical component or the process flow for manufacturing the electrical component.

BRIEF DESCRIPTION OF THE DRAWINGS

In the following the disclosure will be described in greater detail by means of preferred embodiments with reference to the accompanying drawings, in which.

DETAILED DESCRIPTION

Figure 2:
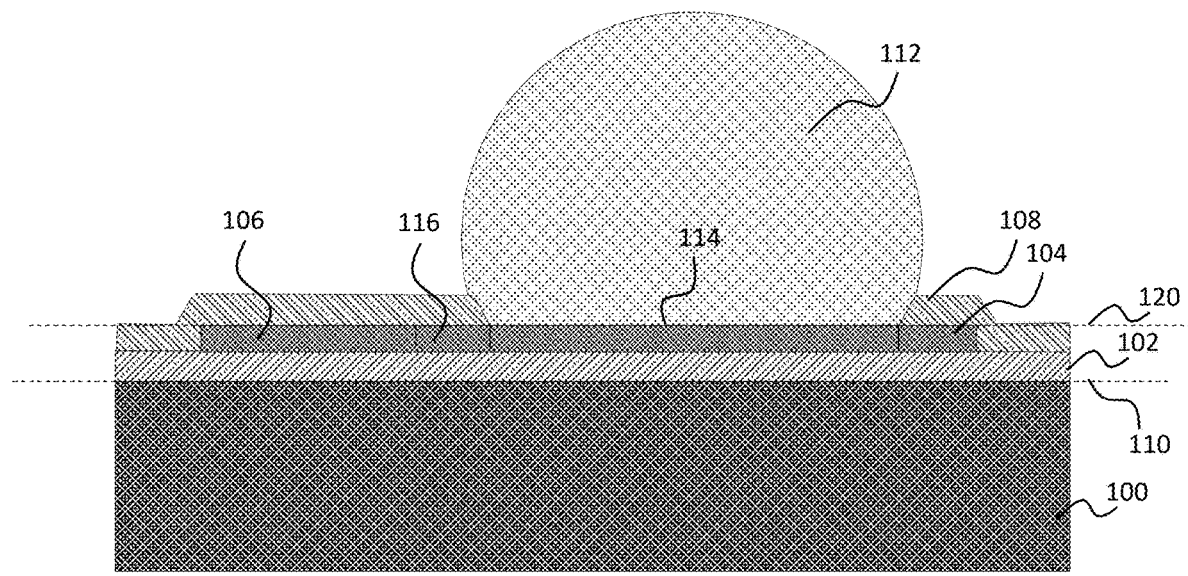
FIG. 2 illustrates a sectional side view of an electrical component structure.
Figure 4:
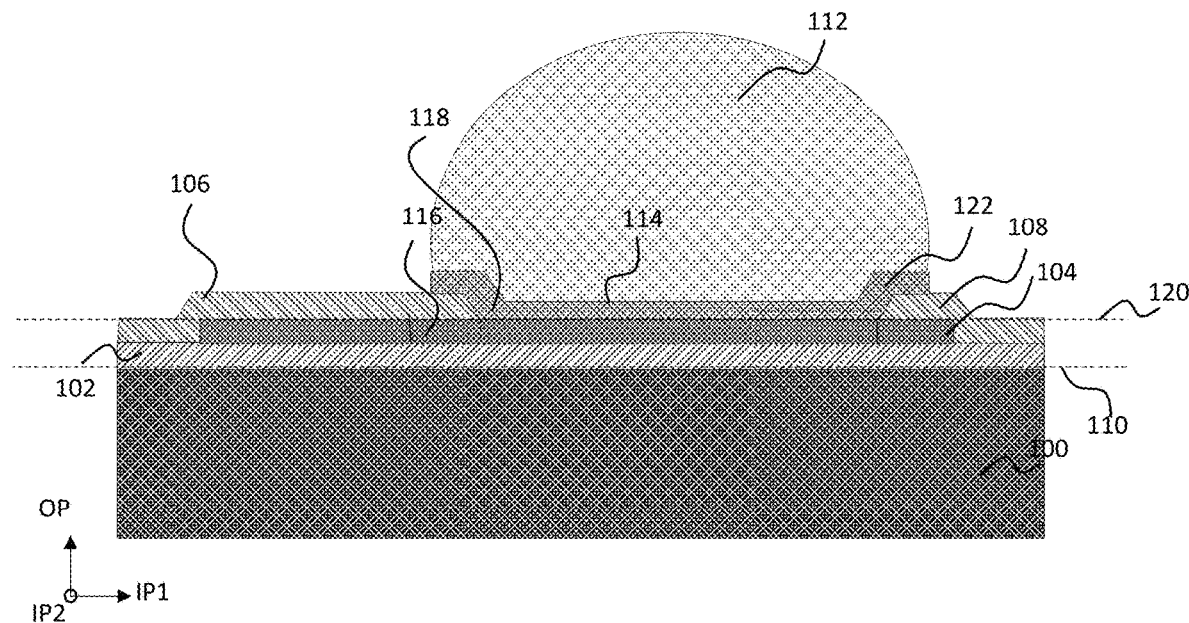
FIG. 4 illustrates a sectional side view of an electrical component structure.

FIGS. 2 and 4 show sectional side views of a conventional electrical component structure applied when the electrical component is interconnected to another circuit element, for example to a printed circuit board, by a conductive component interconnection element. For conciseness, component interconnections are described in the following by means of solder ball interconnections. It should be noted, however, that the invention is not limited to soldering or solder ball interconnection, other type of conductive elements that enable both mechanical and conductive interconnection between two electrical components can be used within the scope. Examples of such alternative component interconnection elements include copper pillars, solder coated copper pillars, solderable land areas and metal and/or solder coated plastic spheres, among others. Furthermore, the interconnection can be implemented without soldering, with conductive adhesive materials as solder replacement.

Accordingly, as an example of a structure with conductive component interconnection element, a structure with a solder ball is shown. The term solder ball refers here to a small volume of fusible metal alloy that is used to bond metal elements to each other. The electrical component to be packaged typically includes a redistribution layer structure with pads for solder ball connections and leads for interconnections embedded into a dielectric material. A solder ball may be reflow soldered to a recess on top of a redistribution layer pad as shown in FIG. 2, or to an under ball metallization pad as shown in FIG. 4.

The electrical component is typically a layered structure that includes formations of material deposited on top of each other. A main planar direction of the layers typically depends on the planar form of the substrate of the electrical component and this main direction is considered herein as a reference plane. The reference plane extends in a first in-plane direction IP1 and a second in-plane direction IP2, shown in FIGS. 2 and 4. The second in-plane direction is orthogonal to the first in-plane direction, and an out-of-plane direction OP is orthogonal to the first in-plane direction IP1 and the second in-plane direction IP2. The out-of-plane direction OP may be called a vertical direction and the in-plane directions then refer to horizontal directions. The claimed features are disclosed by describing parts and elements of one interconnection element in a single electrical component, but as a person skilled in the art of microelectronic packaging understands, the fabrication (patterning, depositing, solder ball assembly, etc.) steps are typically implemented in panel- or wafer-level processes, after which single electrical components are diced from a resulting panel or wafer package.

A first layer in FIG. 2 thus illustrates a substrate 100, a semiconductor base on which other materials can be deposited. The substrate may be provided, for example, by a silicon wafer, or a reconstituted wafer structure with an embedded silicon die. To provide a suitable electrical insulation between conducting parts of the redistribution structure and the semiconductor material of the substrate 100, a first dielectric layer 102 (later DL1) is deposited on the substrate. The term layer refers here to a continuous or patterned film of even thickness and with internally consistent material characteristics, and the term deposit refers here to a range of processes used to deposit this continuous or patterned layer of material conformally on an underlying solid surface. In other words, a layer that has been deposited on top of a solid surface mainly follows the shape or profile of the underlying surface structure but it may also smooth, planarize and/or embed abrupt steps due to local flow of the material during deposition. A reference plane 110 aligns to the main planar direction of the surface of the substrate 100 and shows in FIG. 2 as the interface between the substrate 100 and the DL1 102.

In this example, DL1 is a continuous layer that extends the substrate parallel to the reference plane. DL1 may contain openings for contacting part of the redistribution layer to e.g. connection points of a silicon die but they are not shown or discussed here. A redistribution layer is patterned layer that extends on DL1 but does not cover all parts of DL1, leaving parts of DL1 to be covered by subsequent layers. Parts of the redistribution layer that show in FIG. 2 include a redistribution layer pad 104 (later: RDL pad), and a redistribution layer lead 106 (later RDL lead) that integrates the RDL pad 104 into an overall redistribution layer structure of the electrical component. The RDL pad 104 forms a conductor base whose dimensions in the IP1 and IP2 directions are compatible with the dimensions of a solder ball 112, and the RDL lead 106 is a narrower conductor track that leads to one or more connection points in the electrical component.

A second dielectric layer 108 (later DL2) extends on the DL1, provides insulating parts of the redistribution layer and covers parts of the RDL pad. Accordingly, DL2 is a patterned layer so that on the RDL pad, the DL2 includes an opening for connection of a solder ball 112. It is to be noted that the term 'opening' in this text thus does not refer to a void space within DL2 but to a patterned local discontinuity in the layer volume of the DL2, extending through the DL2. In later manufacturing stages, this local discontinuity becomes filled with material of the component interconnection element, here the solder ball. Accordingly, after the solder reflow process, the solder ball 112 becomes connected to a central contact region 114 through which the solder ball 112 is in mechanical and electrical contact with the underlying RDL pad 104. Consequently, parts 116 of the DL2 are outside the contact region 114 of the solder ball 112 and cover the RDL pad 104 so that the RDL pad is enclosed between the two dielectric layers DL1 and DL2. Outside the periphery of the RDL pad 104, the DL2 extends on the DL1 or on other parts of the redistribution layer. The material of the dielectric layers DL1, DL2 may be, for example, polyimide, benzocyclobutene (BCB), copolymer of ethylene glycol di-methacrylate and hydroxyethyl methacrylate (Spheron™) or similar material used in wafer level packaging technology. The material of the redistribution layer may be, for example, copper. Other dielectric and conducting materials may be used within the scope.

Figure 3:
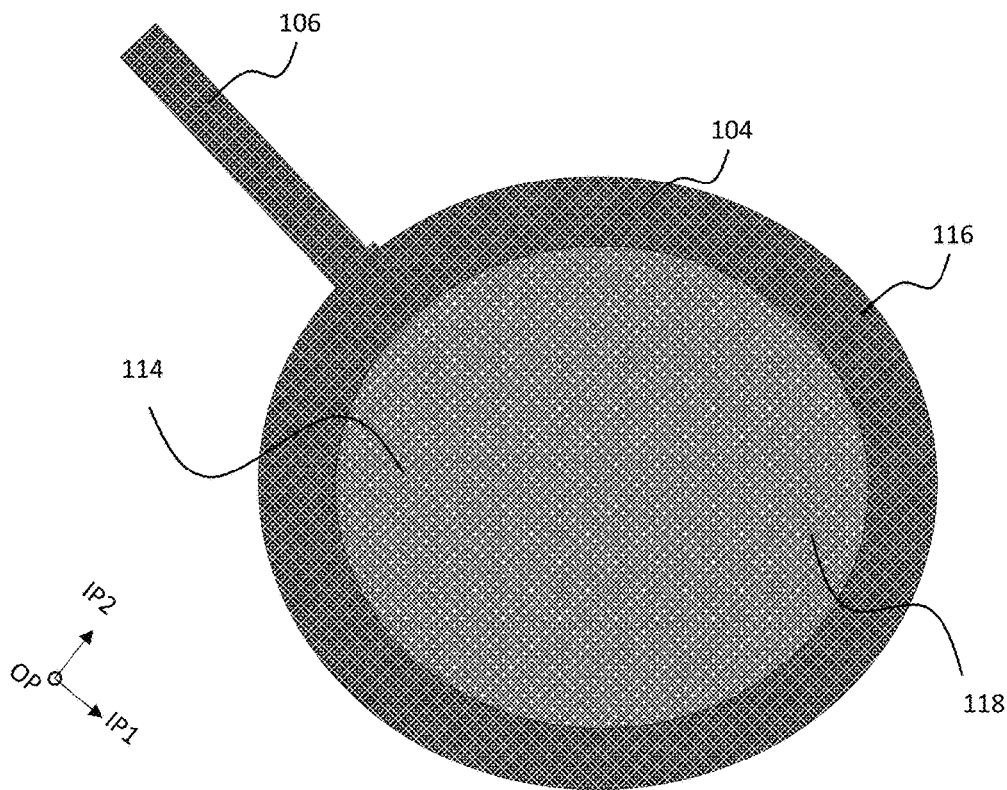
FIG. 3 FIG. 3 illustrates a sectional top view of the component structure of FIG. 2.

FIG. 3 illustrates a sectional top view of the component structure of FIG. 2, taken along a plane 120 running on the redistribution layer pad, parallel to the reference plane. FIG. 3 shows the RDL pad 104 and the RDL lead 106 lying on DL1 and embedded into the DL2 108 (not shown) such that the DL2 material surrounds and covers some of the conducting metallic parts. Specifically, the DL2 also covers the outermost parts 116 of the RDL pad but includes an opening 118 that surrounds a central part of the RDL pad. As mentioned, the opening is a local discontinuity that progresses in the out-of-plane direction (vertically) through the layer volume of the DL2. This central part forms the contact region 114 through which the solder ball 112 and the RDL pad 104 are in contact when the solder ball is in place. The term solder ball implies that the elements used for accommodating the solder are often fabricated to have a mainly circular form since this form avoids stress concentrations produced by corners. Accordingly, a cross section of the opening 118 is advantageously smaller than the RDL pad so that the opening surrounds the contact region and has a mainly circular form. FIG. 2 shows an example where the opening 118 has a fully circular form. As will be discussed later, other forms are also possible within the scope.

FIG. 4 shows a sectional side view of an alternative configuration that includes the elements of FIG. 2, and in addition to them includes a second conducting layer element, an under ball metallization pad 122 (later: UBM pad) between the RLD pad 104 and the solder ball 112. The UBM pad 122 is a conducting film that is fabricated on the electrical component, fills the opening 118 in the DL2 and covers part of the DL2 in areas outside the opening. Typically, the cross-section of the UBM pad 122 is smaller than the cross section of the RDL pad 104, as shown in FIG. 4. The UBM may be of copper or nickel or it may consist of a stack of two or more metal layers. The UBM metal stack may consist of, for example, copper and/or nickel and/or gold and/or chromium and/or titanium and/or titanium-tungsten and/or nickel-vanadium and/or silver.

Figure 5:
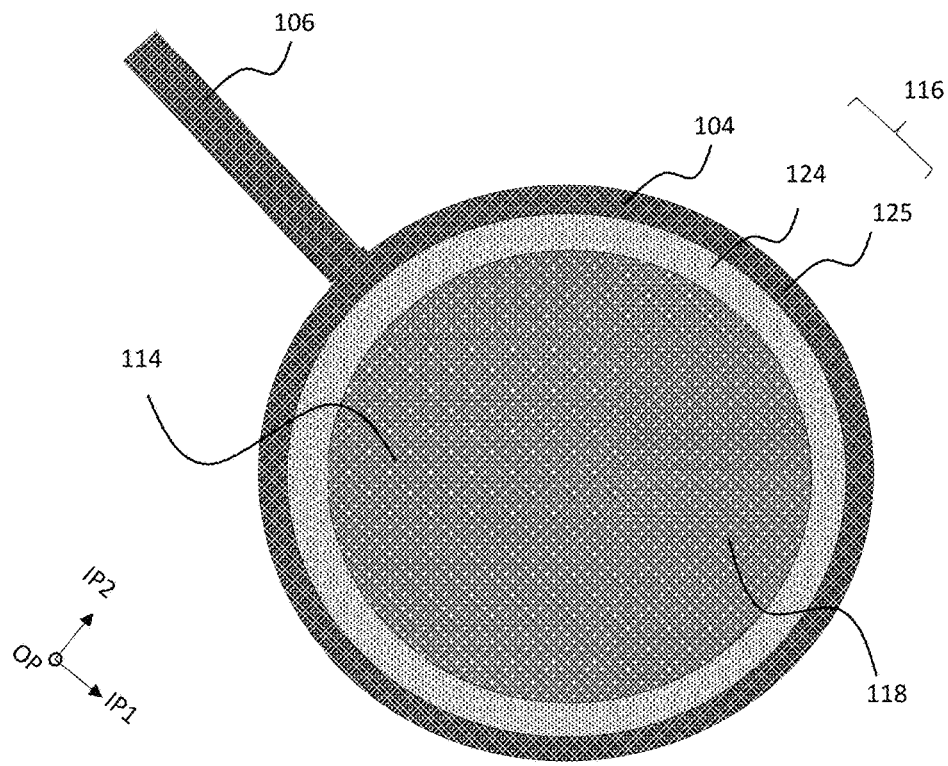
FIG. 5 illustrates a sectional top view of the electrical component structure of FIG. 4.

FIG. 5 illustrates a sectional top view of the electrical component structure of FIG. 4, taken along the plane 120. The central contact region 114 is again formed on the RDL pad by the opening 118 in the DL2, but the contact between the solder ball and the RDL pad is now made through the UBM pad. Also here, the DL2 covers the outermost parts 116 of the RDL pad but includes an opening 118 that surrounds a central part of the RDL pad. The outermost parts 116 include an inner region 124 and an outer region 125. In the inner region 124, the UBM pad is on the RDL pad but separated from it by the DL2. The outer region 125 denotes the parts where the RDL pad is covered by the DL2, without the UBM pad.

The UBM pad is applied in most solder ball applications to increase package reliability but in view of the mechanical stress upon the RLD pad, the forces by the solder ball are similarly transferred to the RDL through the combination of the solder ball and the UBM pad. Accordingly, the term component interconnection element is used in the following to refer to the solder ball itself in embodiments without the UBM pad, and to the combination of the solder ball and the UBM pad in embodiments with the UBM pad.

Figure 1A:
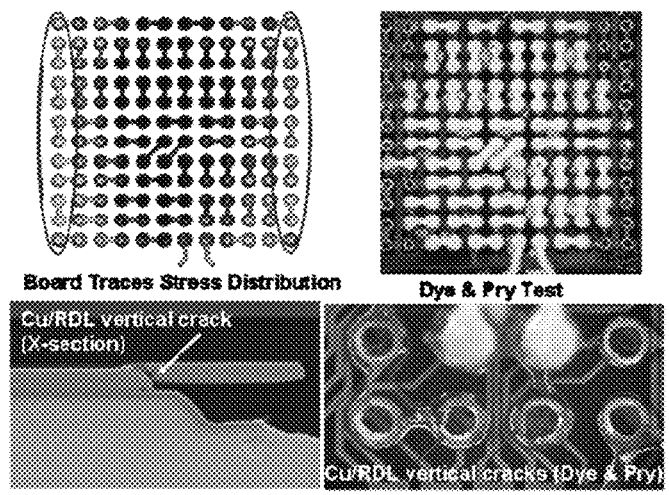
FIG. 1A shows example images of redistribution layer pad cracking.
Figure 1B:
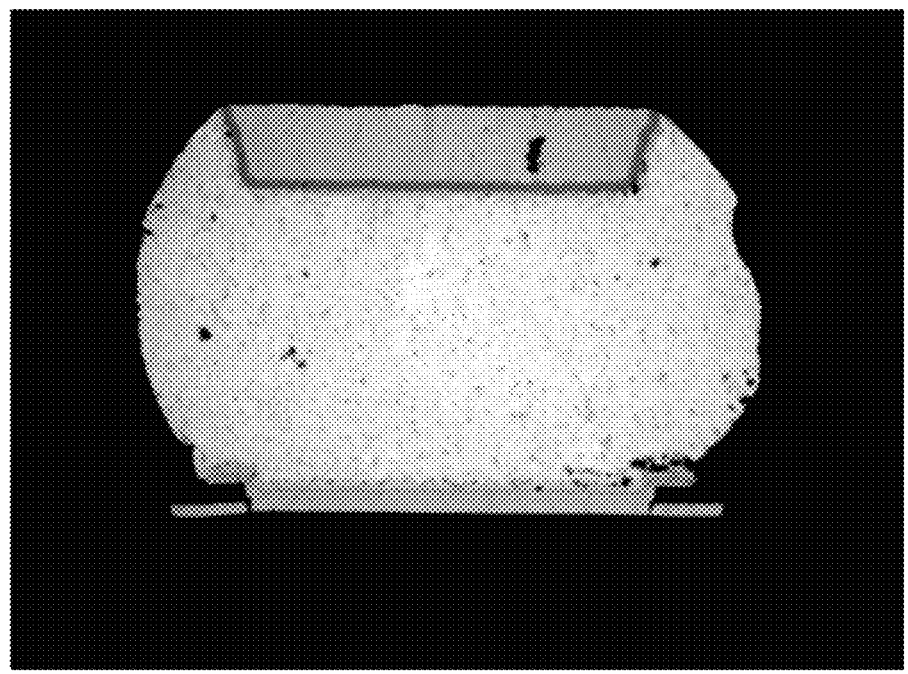
FIG. 1B shows a cross section of a solder ball and redistribution layer pad after a plurality of thermal cycles.
Figure 6A:
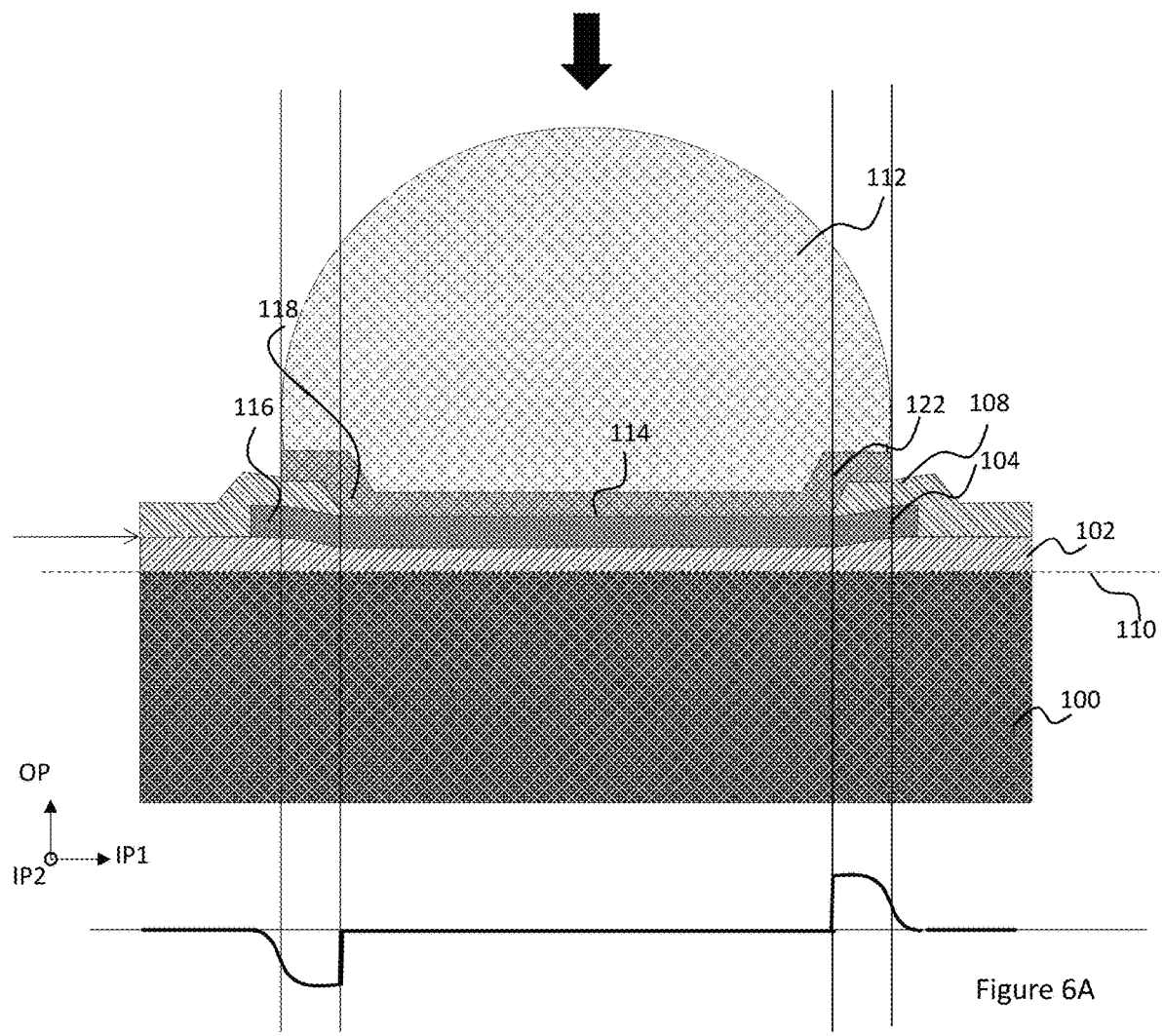
FIG. 6A visualizes bending of an RDL pad of FIG. 4 when the solder ball is subject to vertical loading force.

The risk of cracking or fracturing of the RDL pad, as shown in FIGS. 1A and 1B, is highest at the perimeter of the opening 118 in the DL2. The mechanism of the crack formation in copper is fatigue caused by cyclic bending of the outer part 116 of the RDL pad. The dielectric materials applicable in the dielectric layers DL1 and DL2 are very elastic compared with the metal materials and silicon and will compress and/or expand easily when exposed to mechanical stress. A modulus of elasticity (Young's, shear, bulk) of DL1 and DL2 is at least ten five times higher than the same modulus of elasticity of the redistribution layer pad, the solder ball and the substrate. When the solder ball is subject to deflecting forces, they are transmitted differently to different parts of the RLD pad, depending on the composition of the layer structure at each point. The boundary of the opening 118 in the DL2 provides an abrupt discontinuity in the layer structure composition as the thickness and thus the stiffness of the RDL-solder ball combination suddenly greatly increases compared to that of the RDL alone. FIG. 6A visualizes bending of the RDL pad of FIG. 4 when the solder ball is subject to loading in the OP direction and FIG. 6B visualizes bending of the RDL pad of FIG. 4 when the solder ball is subject to loading in IP1 and/or IP2 directions. Loading in this context means that the solder ball has undergone a further reflow process through which it connects to a contact pad in a circuit board in the same package. When subject to temporal changes in the operating conditions, like variations in temperature, the materials in the electrical components respond to them differently, causing deflections and displacements in the combined structure. The solder ball experiences these displacements as an external force loading it. Most often the loading of a solder ball is a combination of loading in the OP, IP1 and IP2 directions. In the same package solder balls at different locations may experience different loading.

In both cases of 6A and 6B, the edge of the solder ball metallization on the RDL pad will provide an abrupt discontinuity in the layer composition under load. In view of FIG. 6A, without external forces, the RDL pad is parallel to the reference plane 110. When a force in the OP direction loads the solder ball by pushing it towards the DL1, the force is transmitted through the metal elements (solder ball and SBM pad) to the DL1 under the contact region of the RDL pad. The curve under the disclosed structure illustrates variation of the angular displacement of the RLD pad from the reference plane along its diameter in FIG. 6A. It is seen that in parts under the contact region, the angular displacement is negligible. At the boundary of the opening 118, the elasticity of the DL2 takes effect and the DL1 compresses less. The angular displacement of the RDL pad first increases abruptly, but evens out when moving towards parts 125 without the external loading. The mechanical stress of the RDL layer is proportional to the derivative of the angular displacement and is thus very large at the boundary of the opening 118. In FIG. 6A the loading is shown to compress the thickness of DL1 but the loading can as well be to the opposite direction and thence expand the thickness of DL1. Under cyclic alternating loading the direction of the load may vary temporarily so that compression and expansion of DL1 will alternate. Alternating loading may eventually lead to fatigue and cracking at the location with high mechanical stress.

Figure 6B:
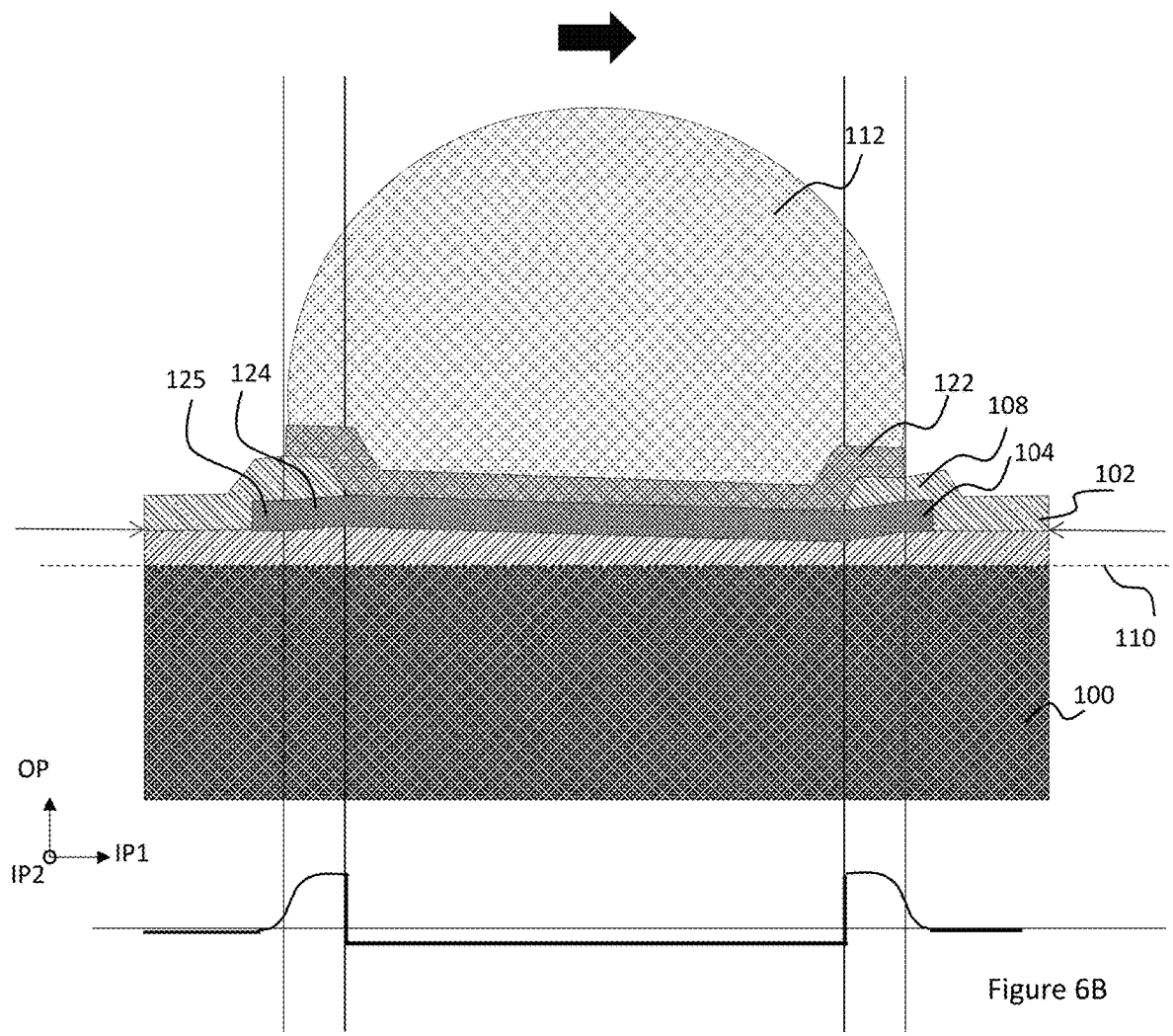
FIG. 6B visualizes bending of the RDL pad of FIG. 4 when the solder ball is subject to horizontal loading force.

In FIG. 6B, the similar effect is detected. The difference is that the in-plane loading of the solder ball causes an initial angular displacement to the RDL pad and compression of DL1 on the right side and expansion on the left side. However, the abrupt change in the bending of the RDL pad around the contact region occurs in both cases with the associated stress concentration at the same location. In FIG. 6B the direction of the loading is to the right but the loading can be as well to the opposite direction and thence compress and expand the thickness of DL1 in opposite fashion to that of FIG. 6B. Under cyclic alternating loading the direction of the load may vary temporarily so that compression and expansion of DL1 will alternate on both sides of the solder ball. Alternating loading may eventually lead to fatigue and cracking at the location with high mechanical stress.

FIGS. 7A, 7B, 7C and 7D illustrate an example of an electrical component structure that alleviates this problem. In this example, the electrical component is one where the component interconnection element includes a solder ball (not shown) and an UBM pad. Description for the basic structural elements like a substrate 700, a DL1 702, an RDL pad 704, an RDL lead 706, a DL2 708, an outermost part 716 of the RDL pad, an inner region 724 and an outer region 725 of the outermost part of the RDL pad can be referred also from FIGS. 2 to 4. The redistribution layer is deposited in a patterned form on DL1, and the DL2 is deposited on the redistribution layer so that in the in-plane directions IP1, IP2, the conducting metallic parts of the redistribution layer do not fully cover DL1, and DL2 material surrounds or embeds the conducting metallic parts like the RDL lead 706. The DL2 also covers the outermost parts 716 of the RDL pad 704 but includes a dielectric layer opening 718 (hereinafter DL layer opening) in the central part of the RDL pad 704. In other words, as shown in FIGS. 7A, 7B, 7C and 7D, the perimeter of the DL layer opening 718 is fully within the perimeter of the RDL pad 706. This central part created by the opening 718 forms the contact region 714 through which the solder ball 710 and the RDL pad 706 are in contact.

In the illustrated component structure, the DL layer opening 718 in the DL2 includes at least one protrusion 720 that extends radially from the side wall of the DL layer opening 718 towards a central point 740 of the contact region 714 on the RDL pad 704. As discussed earlier, the DL layer opening 718 is a patterned recess, in other words a local discontinuity through the DL2, and side walls of the DL layer opening refer to the walls of that recess. The side walls thus extend essentially in the OP direction, but the recess can be fully cylindrical, as shown in FIG. 7B, or slightly tapered, as shown in FIG. 2, depending on the sidewall angles produced by patterning of the layers and on the tendency of the deposited layer to smooth out underlying steps.

The contact region in the bottom of the recess has a form defined by the form of the DL layer opening in the DL2 on the RDL pad. In this example, the form of the opening is mainly circular, meaning that it is possible to define a center for the opening on the RDL pad with a reference central point 740 and a reference circle 742, wherein outer extremes of the boundary of the DL layer opening 718 on the RDL pad align with the reference circle 742. In the example of FIG. 7, outer extremes of the boundary of the opening 718 align fully with the reference circle 742, except in the section where the protrusion is. It is, however, noted that other forms for the opening may be applied within the scope. For example, a rounded square shape may be advantageous for increased pitch of solder balls or similar adjacent interconnection means. Rounded rectangle may be optimal for solderable land areas. Further alternative forms include square, rectangle, and oval forms. With all forms, it is possible to define for the opening on the RDL pad a reference central point and a reference perimeter of the square, rectangle, rounded rectangle and oval form, such that outer extremes of the boundary of the opening on the RDL pad align with the reference perimeter. With forms that are not circular, the reference central point can be considered to coincide e.g. with a point of symmetry of the reference perimeter.

Figure 7A:
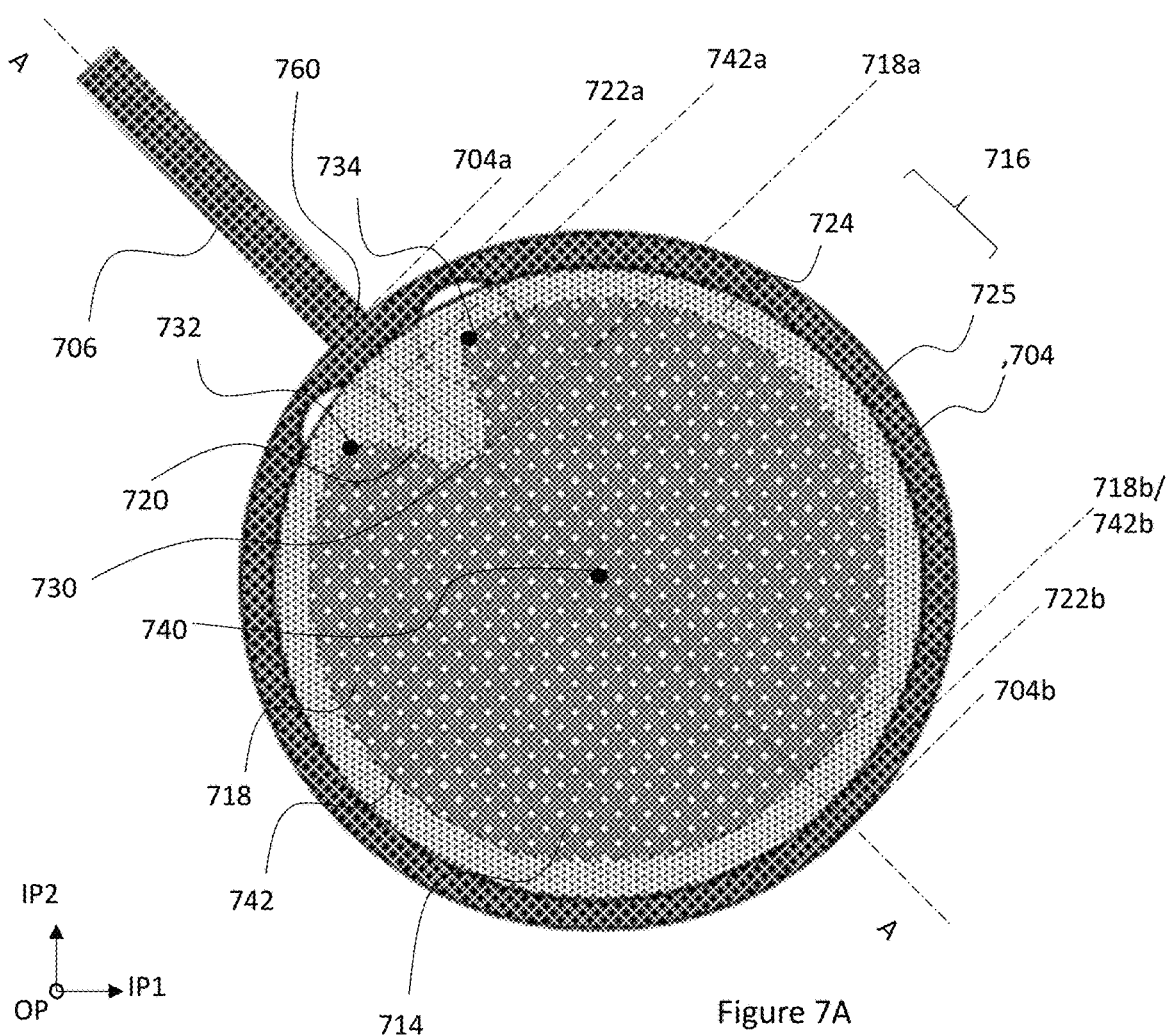
FIGS. 7A to 7D illustrate different views to an example of the improved electrical component structure.

The protrusion 720 refers herein then to a part of the DL2 that juts out from the reference perimeter of the boundary of the opening 718. Advantageously the protrusion projects inwards in direction orthogonal to the perimeter of the pad which in case of a circular pad is radially towards the reference central point 740, as shown in FIG. 7A. For a person skilled in the art it is clear that due to manufacturing tolerances, the boundary of the opening may in practise deviate to some extent from its ideal form, in this example from an ideal circle. The protrusion 720 is, however, to be distinguished from such deviations in its full device configuration. An extreme point of the protrusion 720 from the reference perimeter towards the center of the contact region is a tip 730 of the protrusion, and a base of the protrusion is between two outer extreme points 732, 734 of the protrusion in the opening 718 away from a center of the contact region 714. A center for an opening on the RDL pad refers to the reference central point or to a region extending from the reference central point. In other words, the protrusion has two base points 732, 734 where the perimeter of the DL layer opening 718 following the tip 760 of the protrusion is farthest from the center (in this example the reference central point 740) of the redistribution pad. Accordingly, on each side of the tip of the protrusion, the protrusion has two base points where the radius of curvature of the boundary of the DL layer opening has a local minimum. Considering that the DL2 has a thickness in the out-of-plane direction OP, and a distance from the tip 730 of the protrusion to the base of the protrusion along the reference plane is an in-plane height of the protrusion, the in-plane height of the protrusion is at least equal to the thickness of the DL2. Typical thickness of the DL2 layer is from 5 to 10 µm.

Figure 7B:
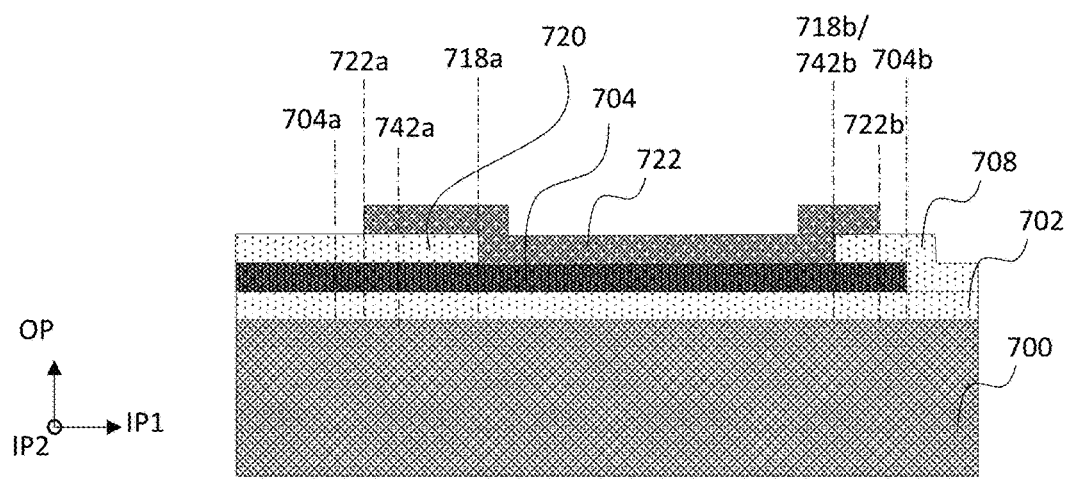

FIG. 7A shows the disclosed elements in a top view projection and FIG. 7B shows a side view projection of them along a line A-A that intercepts the protrusion 720. In the top view projection of 7A, opposite outer edges of the RDL pad 704 are denoted with references 704a and 704b. As mentioned above, the electrical component is one where the component interconnection element includes a solder ball (not shown) and an UBM pad 722. Opposite outer edges of the component interconnection element (here the UBM pad 722) are denoted in FIG. 7A with references 722a and 722b. Opposite edges (side walls) of the DL layer opening 718 of the DL2 are denoted with references 718a and 718b. In addition to these earlier disclosed elements, FIG. 7A shows in the RDL pad two openings, which will be discussed in more detail with FIGS. 7C and 7D.

FIG. 7B shows the same elements in side view projection along line A-A of FIG. 7A. As shown in FIG. 7B, in addition to its horizontal dimension, the protrusion 720 has a vertical dimension between the component interconnection element (here the UBM pad 722) and the RDL pad 704. The protrusion 720 has thus two vertical sides in the OP direction and a horizontal bottom that is against the RDL pad 704. In conventional structures, which correspond to the part in the right-hand side of the shown structure, when external loading pushes the solder ball 710 towards the DL1 and the DL1 is compressed, the center of the rigid body formed by the UBM pad 722 and the contact region on the RDL pad move towards the DL1. However, the outermost parts 716 in the fringe of the RDL pad move less since DL2 is between the RDL pad and the UBM pad. This makes the RDL pad to flex and the flexure will be abrupt in positions of the boundary of the DL layer opening 718. When such flexing is repeated many times, fatigue and cracking of the RDL pad tends to occur.

However, when the DL layer opening 718 includes the protrusion, which shows in the left-hand side of the shown structure, the sides and the bottom of the protrusion are a continuation of the boundary of the DL layer opening 718 in DL2, but the RDL pad 704 will not flex, or will flex significantly much less on the area of the protrusion 720. This is because of the nearness of the sides and the bottom of the protrusion to each other. The bending rigidity of the RDL (e.g. 8 µm thick copper) is high enough to prevent flexing because in a protrusion, the side walls of the boundary of the DL layer opening 718 in DL2 are located close to each other. For this, the largest distance between the sides of the protrusion is advantageously less than 30 times the thickness of the RDL pad. The RDL pad will flex along the base of the protrusion 720 (extension of the boundary of the opening 718 across the protrusion on the RDL pad), but this flexing is rather smooth since there is no rigid body attached to the RDL pad with abrupt discontinuity at this location. Such smooth flexing does essentially not cause fatigue and cracking since the mechanical stress is distributed on a wider area around the bottom of the protrusion and not concentrated as is the case with abrupt discontinuity. In other parts of the boundary of the opening on the RDL pad, in parts where the opening coincides with the reference circle 742, the stress remains concentrated. It is understood that the part of the RLD pad outside the protrusion can be expected to undergo the described flexing and be at risk of cracking. However, the part protected by the projection will remain operative so that the conducting connection from the UBM pad 722 through the RDL pad 704 to the RLD lead 708 is maintained. The disclosed structure already increases reliability of the metallic pad without essentially changing the overall dimensions of the electrical component or the process flow for manufacturing the electrical component.

As shown in FIG. 7A, the RDL pad 704 integrates to the further redistribution layer structure though the RDL lead 708. The RDL lead connects to the RDL pad through a peripheral contact region 760. Advantageously, but not necessarily, in a radial direction of the circular form, the base of the protrusion at least partly coincides with the peripheral contact region 760 of the RDL lead. The radial direction of the circular form is one of the radiuses of the reference circle 742.

Figure 7C:
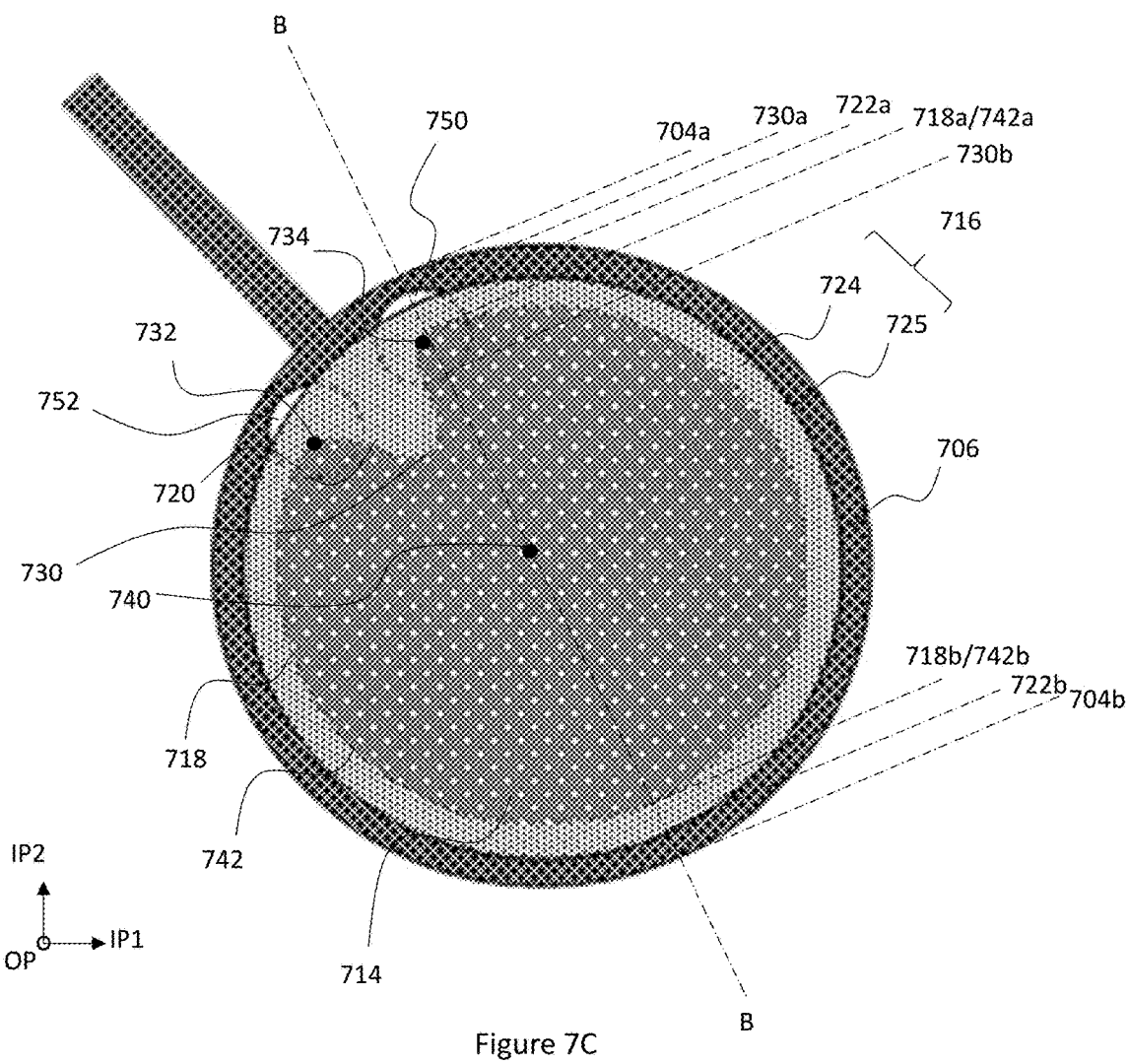
Figure 7D:
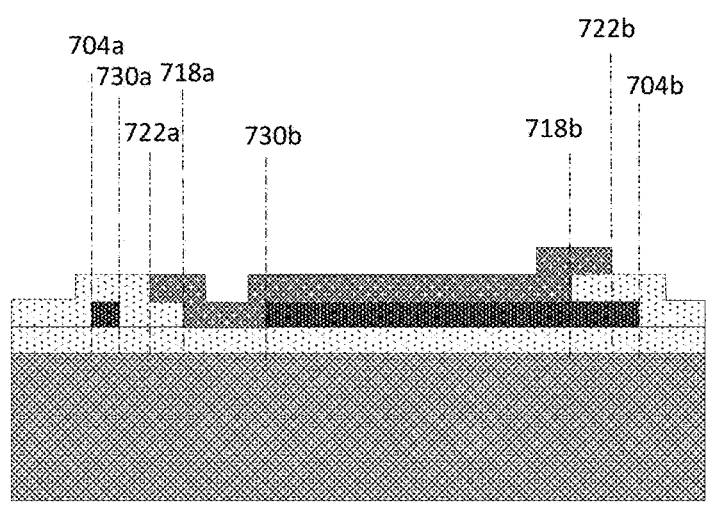

FIG. 7C shows the earlier disclosed elements in a top view projection and a line B-B that does not intercept the protrusion 720. FIG. 7D shows a side view projection of the deposited layer elements along said line B-B. In addition to the earlier disclosed elements, FIG. 7C shows two openings in the RDL pad, a first RDL pad opening 750 and a second RDL pad opening 752. The first RDL pad opening 750 and the second RDL pad opening 752 (RDL opening) are positioned so that there is one opening on both sides of the protrusion. FIG. 7C shows the tip of the protrusion 730, and the two base points 732, 734. This top view a projection of the structure on the reference plane in FIG. 7C illustrates an optional advantageous example where each of the first RDL pad opening and the second RDL pad opening coincides with a respective base point of the protrusion. In other words, the first RDL pad opening 750 coincides with one base point 734 and the second RDL pad opening 752 coincides with another base point 734 of the protrusion 720. Each of the first RDL pad opening and the second RDL pad opening has a smooth form. Smooth form of an opening in this context means that the perimeter of the opening forms a smooth curve with at least one continuous derivative. The perimeter of the boundary of the opening is thus continuous without abrupt discontinuities or corner points.

Figure 8:
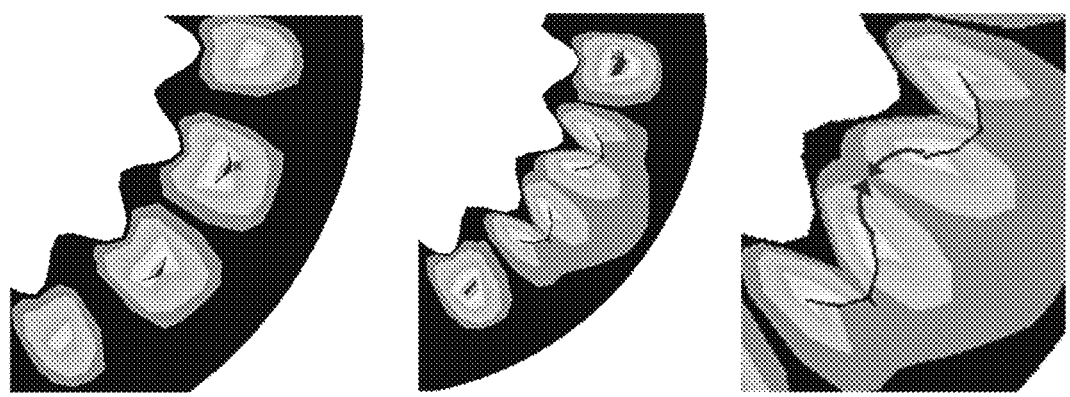
FIG. 8 illustrates a closeup of cumulative strains on an RLD pad.

It has been detected that the advantageous effect of the protrusion is somewhat compromised by a cumulative plastic strain that is concentrating to strain maxima on the RDL pad at the location of the protrusion. FIG. 8 shows a closeup of such cumulative strains on an RLD pad in an example where the DL layer opening includes more than one protrusion. The locations that show with the darker base indicate minimal plastic strain and the gradually changing shades indicate a gradually increasing strain. It can be seen that the strain concentrates to the base of each protrusions, and strain-free areas are in-between the strain concentrations. This effect has been detected even with very shallow protrusion forms.

FIG. 8 shows also that the RLD pad easily cracks at such strain maxima, and the crack easily propagates from a strain maximum to the other strain maximum over the base of the protrusion. A crack alone is highly undesirable, and as shown in FIG. 8, a crack may propagate over the protrusion, or over the whole peripheral rim of the RDL pad, if the DL2 includes more than one protrusions The ends of the crack are acting as stress concentrators and the crack will extend and neighboring cracks will gradually grow together.

Figure 9:
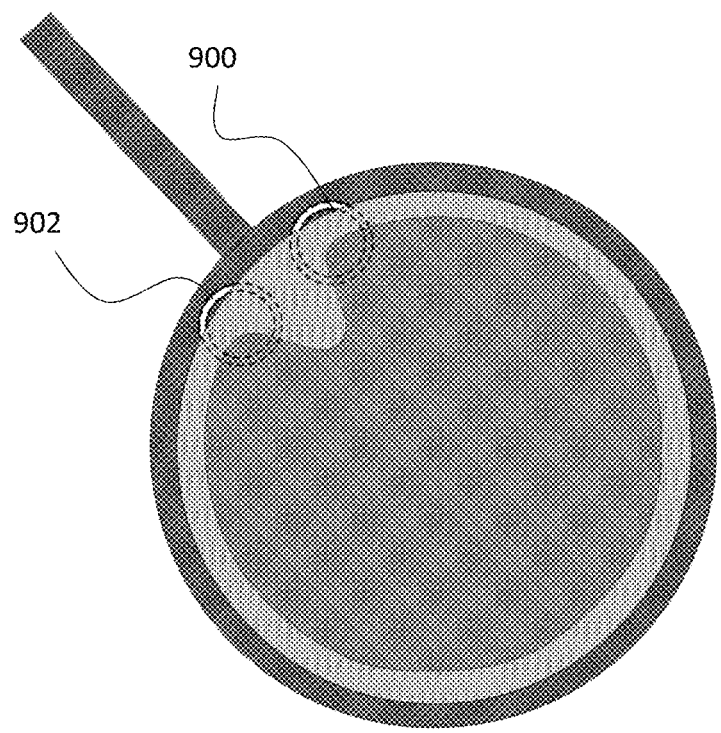
FIG. 9 illustrates an example of a closed groove.

The effect of the first RDL pad opening and the second RDL pad opening in the RDL pad on both sides of the protrusion is that if a crack is formed, it may propagate to a boundary of an RDL opening (the first RDL pad opening or the second RDL pad opening) but will not continue propagating beyond the RDL opening. The crack will meet a smooth boundary of the RDL opening, advantageously at an oblique angle to the crack. Because the RDL opening has the smooth form, the boundary does not give rise to continuation of the crack on the other side of the opening at any location. The RDL opening may have a form of a circle, oval, ellipse, rounded rectangle, rounded polygon or a closed groove with any of the aforementioned shapes. It is to be noted that the first and second RDL pad openings may also totally prevent the initial crack formation if they don't have any inner areas with RDL metallization. As an example, FIG. 9 illustrates an embodiment where the RDL pad openings are implemented as closed grooves 900, 902 that have a form of a circle. RDL opening with circular groove form has an inner RDL area where the crack may initiate but it will not propagate outside the outer boundary of the groove. The circular groove form has the advantage that it will keep the geometry of the RDL pad almost unchanged and will thus have a minimal influence on the formation and shape of the solder ball.

Figure 10:
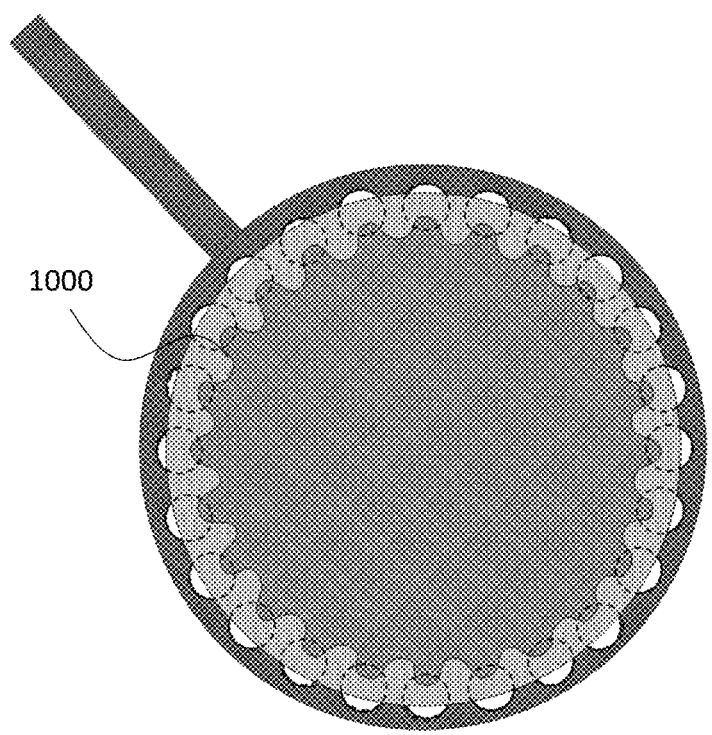
FIG. 10 illustrates an example structure where the opening of the DL2 includes a plurality of protrusions.

FIG. 10 illustrates another example where the opening of the DL2 includes a plurality of protrusions. The example is again disclosed with the structure where the solder ball metallization includes a solder ball and an UBM pad, but the opening configuration and forms disclosed earlier in this text can be applied to component structures without the UBM pad. In this example, parts of the RDL pad are protected by a plurality of DL2 protrusions between the solder ball metallization and the RDL pad. The plurality of protrusions thus forms a wavy line 1000 that extends over the whole perimeter of the DL layer opening. It can be seen that in a projection on the reference plane, RDL openings between the protrusions (first RDL pad opening or the second RDL pad opening) coincide with at least some base points of the protrusions that form the wavy line.

The example of FIG. 10 is advantageous for the creation of the solder ball since it will affect less the semi-spherical shape of the solder ball than e.g. the example of FIGS. 7A and 7B and will thus not be prone to create weak locations or stress concentrators in the solder ball. For this advantageous effect it may also beneficial to make the protrusions rather shallow. If we define that DL2 has a thickness in the out-of-plane direction OP, the plurality of protrusions have advantageously a shallow form wherein the distance between the base points of the protrusion is 2 to 10 times and advantageously 5 times the thickness of the DL2 and wherein the height of to which each protrusion extends from its base between the two base points towards the central point of the redistribution pad is 1 to 4 and advantageously 2 times the thickness of the DL2. Typical thickness of the DL2 is of the order of 5 to 10 µm. Further, a plurality of protrusions may be advantageous due to additional redundant current paths thus created that remain unaffected by crack formation.

Figure 11:
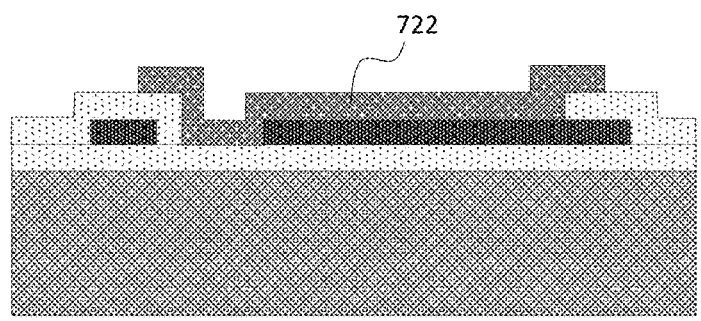
FIG. 11 illustrates an example structure with smaller RDL openings.

In the example of FIGS. 7A to 7D, a part with which a component interconnection element (here the UBM pad) is in contact with the underlying layers is concentric with the central point of the RDL pad. Furthermore, a perimeter of each of the first RDL pad opening and the second RDL pad opening is fully within a perimeter of the RDL pad. The size of the RDL opening may, however, vary within the perimeter of the RDL pad and even beyond the perimeter of the RDL pad. FIG. 11 shows a side view projection of a structure that includes the same layer elements as the structure of FIG. 7A to 7D, but where the RDL openings are smaller. Smaller first and second RDL pad openings may affect the geometry of the solder ball less than larger openings but they may also not fully contain the high stress area associated with the two base points and cracking may initiate more easily at the boundary of the first or second RDL pad openings.

Figure 12:
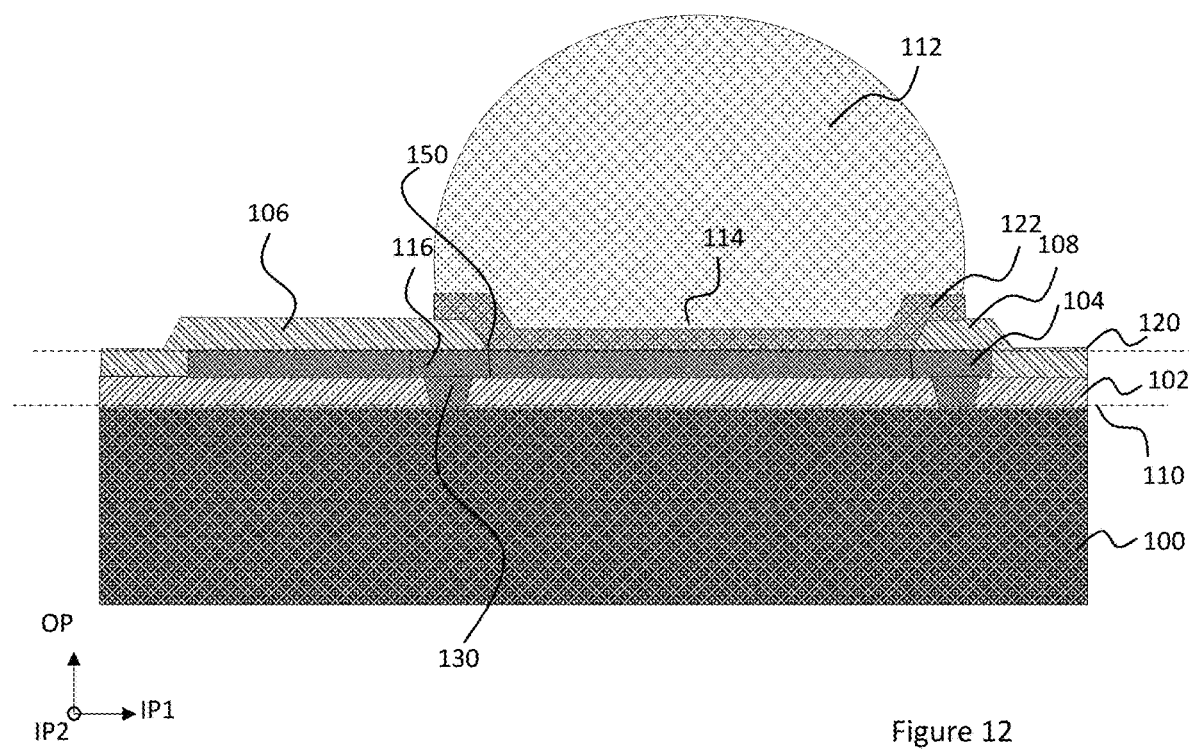
FIG. 12 illustrates a sectional side view of a further embodiment.

FIG. 12 shows a sectional side view illustrating a further embodiment of a structure that comprises the elements that have been discussed earlier with FIGS. 2 to 6 in this text and are denoted with same reference numbers. The structure includes also the RDL pad openings (not shown), explained in more detail with FIGS. 7C and 7D. In addition, the RDL pad includes at least one extension 130 that protrudes from the first side of the RDL pad in the out-of-plane direction through the DL1 to the substrate.

In the example of FIG. 12 this vertical extension is horizontally in a position or positions where a projection of the extension 130 on the reference plane is outside a projection of the pad buffer perimeter 150 on the reference plane 120. The extension 130 is considerably smaller than the RDL pad which means that the first side includes a large mechanical buffer region that is separated from the substrate by the DL1. The mechanical buffering for the interconnection element is provided by elasticity of the DL1 between the less elastic electrical interconnection element, the RDL pad and substrate materials.

At minimum the extension 130 could be configured to comprise one pillar-like extension element that further decreases the risk of contact failures under repeated thermal cycles. In the layer structure, the elasticity of DL1 provides a buffering effect that reduces stress upon the interconnection element, and the one or more protrusions in the DL2 layer opening protect the RDL pad from cracking. The two or more openings in the RDL pad that coincide with bases of the protrusions and thus with stress maxima stop progress of cracks if cracking should still happen. The combination of these effects then tends to build a relatively heavy mechanical strain on DL1 but the extension element effectively reduces the risk of complete detachment of the RDL pad in spite of possible delamination and/or breakage of the DL1 and thus prevents a loss of the electrical and mechanical connection of the solder ball and the RDL pad to the substrate.

As the side view of FIG. 12 already implies, the extension may include more than one extension elements or the extension can be implemented in another form. For example, the extension 130 can have an annular form, formed of two or more separate sectoral extension elements, or an annular ring.

Figure 13:
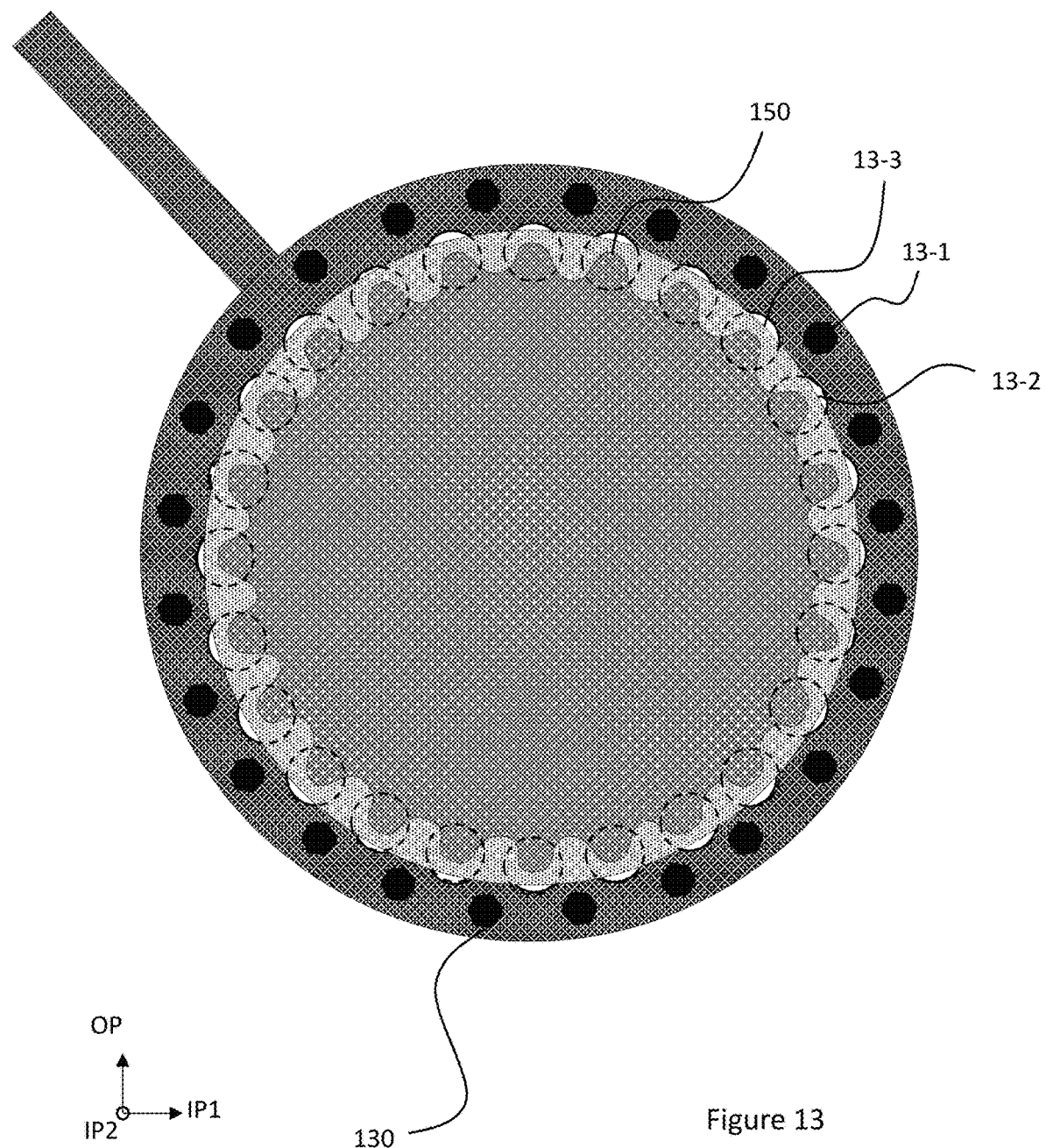
FIG. 13 illustrates a sectional top view of a further embodiment.

FIG. 13 illustrates an embodiment that corresponds to the embodiment of FIG. 10 and thus includes the plurality of DL2 protrusions between the solder ball metallization and the RDL pad. The plurality of protrusions form the wavy line 150 of the pad buffer perimeter 150. In a projection on the reference plane, RDL openings 13-2, 13-3 between the protrusions coincide with the base points of the protrusions in the wavy line. In addition, the structure includes further an extension 130 that protrudes from the first side of the RDL pad in the out-of-plane direction through the DL1 to the substrate. The extension 130 includes a plurality of extension elements 13-1 that are in positions outside a projection of the pad buffer perimeter on the reference plane. In order to minimise in-plane dimensions of the RDL pad, radial position of each of the extension elements 13-1 can be positioned between radial positions of two adjacent openings 13-2, 13-3.

Figure 14:
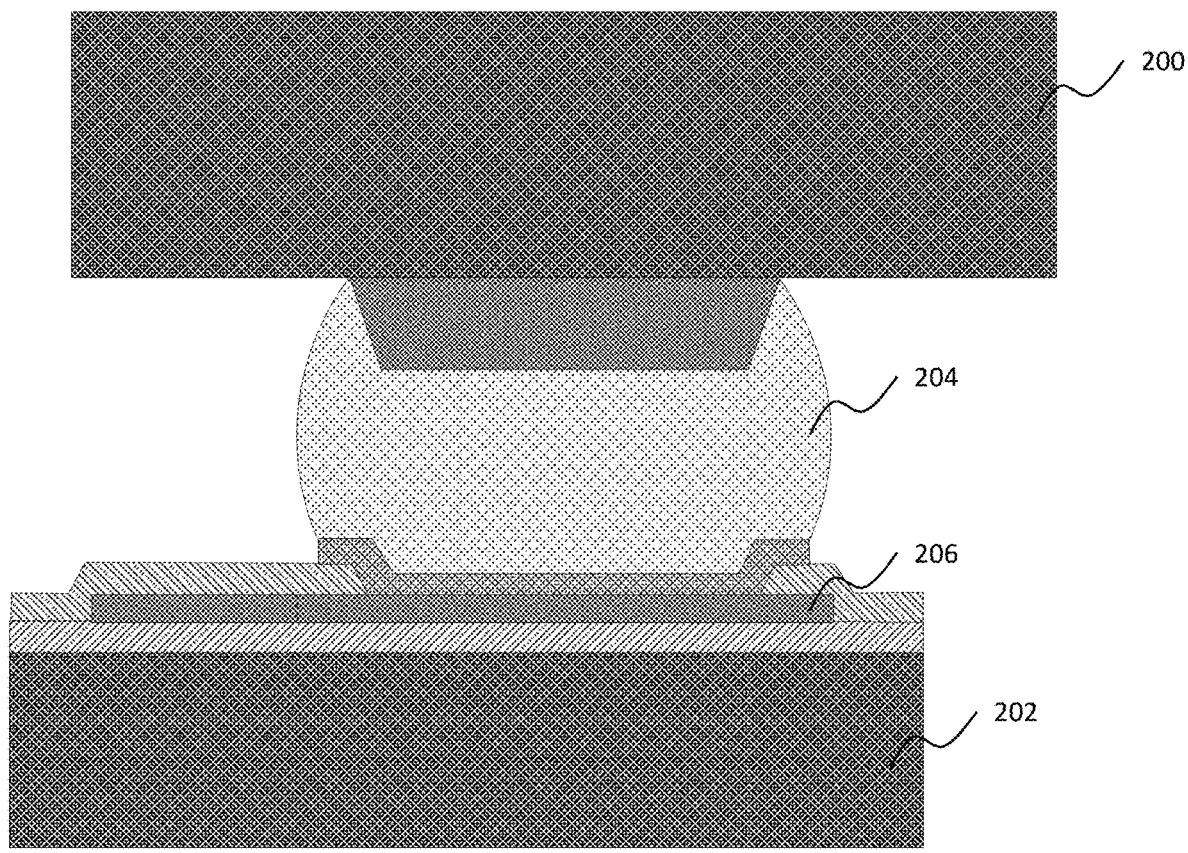
FIG. 14 illustrates a packaged device that includes a circuit board and an electrical component.

FIG. 14 illustrates a packaged device that includes a circuit board 200 and an electrical component 202. The electrical component includes a component interconnection element 204 that provides interconnection to the electrical component through an underlying RDL pad 206, as disclosed with the above examples.

The above examples illustrate that the invention can be embodied in many various ways within the scope defined by the following claims.

The invention claimed is:

1. An electrical component including:
a substrate providing a reference plane that extends in a first in-plane direction and a second in-plane direction, wherein the second in-plane direction is orthogonal to the first in-plane direction, and an out-of-plane direction is orthogonal to the first and second in-plane directions;
a first dielectric layer deposited on the substrate;
a redistribution layer deposited on the first dielectric layer, the redistribution layer including a redistribution layer pad;
a second dielectric layer deposited on the first dielectric layer and on parts of the redistribution layer pad; wherein
the second dielectric layer includes a dielectric layer opening;
a component interconnection element fills the dielectric layer opening and is in contact with the redistribution layer pad through the dielectric layer opening;
the first dielectric layer and the second dielectric layer are of material that is more elastic than the substrate, the redistribution layer pad and the component interconnection element;
the dielectric layer opening includes at least one protrusion that extends in the in-plane direction radially from the side wall of the dielectric layer opening towards a central point of the redistribution pad;
the redistribution layer pad includes a first RDL pad opening and a second RDL pad opening, one on both sides of the protrusion;
a perimeter of each of the first RDL pad opening and the second RDL pad opening has a smooth form;
in each of the first RDL pad opening and the second RDL pad opening, at least a part of the opening is covered by the component interconnection element extending on the first dielectric layer.

2. The electrical component of claim 1, wherein
an extreme point of the protrusion towards the central point of the redistribution pad is a tip of the protrusion, and the protrusion has two base points where the perimeter of the dielectric layer opening following the tip of the protrusion is farthest from the central point of the redistribution pad;
in a projection on the reference plane, each of the first RDL pad opening and the second RDL pad opening coincides with a respective base point of the protrusion.

3. The electrical component of claim 1, wherein in a projection on the reference plane, the perimeter of the first RDL pad opening and the second RDL pad opening has the form of a circle, an oval, an ellipse, a rounded rectangle, or a rounded polygon.

4. The electrical component of claim 1, wherein in a projection on the reference plane, the first RDL pad opening and the second RDL pad opening is a closed groove with a form of a circle, an oval, an ellipse, a rounded rectangle, or a rounded polygon.

5. The electrical component of claim 2, wherein the dielectric layer opening includes a plurality of protrusions.

6. The electrical component of claim 5, wherein in a projection on the reference plane, the plurality of protrusions form a wavy line that extends over the whole perimeter of the dielectric layer opening, and openings corresponding to the first RDL pad opening or the second RDL pad opening coincide with at least some base points of the protrusions that form the wavy line.

7. The electrical component of claim 5, wherein
the second dielectric layer has a thickness in the out-of-plane direction;
the plurality of protrusions have a shallow form wherein the height to which each protrusion extends radially from its base between the two base points towards a central point of the redistribution pad is between one to four times the thickness of the second dielectric layer.

8. The electrical component of claim 1, wherein in a projection on the reference plane, a perimeter of each of the first RDL pad opening and the second RDL pad opening is fully within a perimeter of the redistribution layer pad.

9. The electrical component of claim 8, wherein in a projection on the reference plane, a part with which a component interconnection element is in contact with the underlying layers is concentric with the central point of the redistribution layer pad.

10. The electrical component of claim 8, wherein in a projection on the reference plane, the perimeter of the part with which a component interconnection element is in contact with the underlying layers is within the perimeter of the redistribution layer pad.

11. The electrical component of claim 1, wherein the component interconnection element includes a solder ball.

12. The electrical component of claim 1, wherein the component interconnection element includes a solder ball and an under-ball metallization pad.

13. The electrical component of claim 1, wherein the component interconnection element includes a copper pillar, a solder coated copper pillar, a metal coated plastic sphere, or a solder coated plastic sphere.

14. The electrical component of claim 1, wherein
the redistribution layer pad integrates to a further redistribution layer structure though a lead;
the lead connects to the redistribution layer pad through a peripheral contact region;
in a radial direction of the circular form, the base of the protrusion or one of the protrusions at least partly coincides with the peripheral contact region of the lead.

15. The electrical component of claim 1, wherein the redistribution layer pad includes a first side against the first dielectric layer;
the first side of the redistribution layer pad includes an extension that protrudes from the redistribution layer pad through the first dielectric layer to the substrate.

16. The electrical component of claim 15, wherein the dielectric layer opening forms a pad buffer perimeter; and a projection of the extension on the reference plane is outside a projection of the pad buffer perimeter on the reference plane.

17. The electrical component of claim 16, wherein the extension includes a plurality of extension elements.

18. The electrical component of claim 6, wherein the wavy line forms a pad buffer perimeter; and a projection of the extension on the reference plane is outside a projection of the pad buffer perimeter on the reference plane.

19. The electrical component of claim 18, wherein radial position of each of the extension elements is positioned between radial positions of two adjacent RDL pad openings.

20. A packaged device including a circuit board and the electrical component of claim 1, interconnection between the circuit board and the electrical component including the component interconnection element of the electrical component.

21. A method of manufacturing an electrical component, the method including:
depositing a first dielectric layer of elastic material on a substrate;
depositing a redistribution layer pad on the first dielectric layer;
depositing a second dielectric layer of elastic material on the first dielectric layer and on parts of the redistribution layer pad; wherein
including in the second dielectric layer a dielectric layer opening that includes at least one protrusion that extends radially from a radial point in the side wall of the dielectric layer opening towards a central point of the redistribution pad;
including in the redistribution layer pad a first RDL pad opening and a second RDL pad opening, positioned on both sides of the protrusion, a perimeter of each of the first RDL pad opening and the second RDL pad opening having a smooth form;
fabricating a component interconnection element that fills the dielectric layer opening and gets into contact with the redistribution layer pad through the dielectric layer opening so that in each of the first RDL pad opening and the second RDL pad opening, at least a part of the opening is covered by the component interconnection element extending on the first dielectric layer.

* * * * *